(12) United States Patent
Zhang

(10) Patent No.: US 10,354,031 B2
(45) Date of Patent: Jul. 16, 2019

(54) INFORMATION PROCESSING BY INTERPENETRATING SIGNAL TRANSMISSION CHANNEL IN DESIGN FOR TESTABILITY OF CHIP

(71) Applicant: Sanechips Technology Co., Ltd., Shenzhen, Guangdong (CN)

(72) Inventor: Fan Zhang, Shenzhen (CN)

(73) Assignee: Sanechips Technology Co., Ltd., Shenzhen, Guangdong Province (CN)

( * ) Notice: Subject to any disclaimer, the term of this patent is extended or adjusted under 35 U.S.C. 154(b) by 31 days.

(21) Appl. No.: 15/505,306

(22) PCT Filed: May 5, 2015

(86) PCT No.: PCT/CN2015/078319
§ 371 (c)(1),
(2) Date: Feb. 21, 2017

(87) PCT Pub. No.: WO2016/026328
PCT Pub. Date: Feb. 25, 2016

(65) Prior Publication Data
US 2017/0270229 A1 Sep. 21, 2017

(30) Foreign Application Priority Data
Aug. 22, 2014 (CN) .......................... 2014 1 0419098

(51) Int. Cl.
*G06F 17/50* (2006.01)
*G01R 31/28* (2006.01)
(52) U.S. Cl.
CPC .......... *G06F 17/5045* (2013.01); *G01R 31/28* (2013.01); *G06F 2217/14* (2013.01)

(58) Field of Classification Search
CPC ............ G06F 17/5045; G06F 2217/14; H05K 999/99; G01R 31/28
See application file for complete search history.

(56) References Cited

U.S. PATENT DOCUMENTS 6,691,301 B2 * 2/2004 Bowen ................ G06F 17/5045
712/15
6,829,753 B2 * 12/2004 Lee ................... B01F 15/00935
716/112
(Continued)

FOREIGN PATENT DOCUMENTS

CN  1841076 A  10/2006
CN  101183140 A  5/2008
(Continued)

OTHER PUBLICATIONS

Supplementary European Search Report in European application No. 15834457.2, dated Jul. 25, 2017, 9 pgs.
(Continued)

*Primary Examiner* — Naum Levin
(74) *Attorney, Agent, or Firm* — Ling Wu; Stephen Yang; Ling and Yang Intellectual Property

(57) ABSTRACT

An information processing method is disclosed, including: determining a module for which a design for testability (DFT) processing is needed, in a chip; establishing, in an including manner, a DFT signal transmission channel in the module for which the DFT processing is needed, and generating a channel file by using a corresponding port signal; and interpenetrating the DFT signal transmission channel layer by layer until the top layer of the chip, according to an instantiated reference relationship. An information processing device and a computer storage medium are also disclosed.

15 Claims, 5 Drawing Sheets

A module, for which a DFT processing is needed, in a chip is determined — 101

A DFT signal transmission channel is established in an including manner in the module for which the DFT processing is needed, and a channel file is generated by using a corresponding port signal — 102

The DFT signal transmission channel is interpenetrated layer by layer until a top layer of the chip, according to an instantiated reference relationship — 103

(56) References Cited

U.S. PATENT DOCUMENTS

| | | | |
|---|---|---|---|
| 6,862,563 B1* | 3/2005 | Hakewill | G06F 9/30145 |
| | | | 703/13 |
| 7,051,309 B1* | 5/2006 | Crosetto | G06F 9/3867 |
| | | | 712/E9.062 |
| 7,065,724 B2* | 6/2006 | Caty | G01R 31/318307 |
| | | | 716/103 |
| 7,100,133 B1* | 8/2006 | Meiyappan | G06F 17/5022 |
| | | | 716/102 |
| 7,584,460 B2* | 9/2009 | Broberg, III | G06F 17/50 |
| | | | 716/135 |
| 7,770,147 B1 | 8/2010 | Spitzer | |
| 7,827,517 B1* | 11/2010 | Orthner | G06F 17/5045 |
| | | | 703/14 |
| 8,103,987 B2* | 1/2012 | Banerjee | G06F 17/5045 |
| | | | 716/100 |
| 8,365,110 B2* | 1/2013 | Chang | G06F 17/5045 |
| | | | 716/101 |
| 8,966,413 B2* | 2/2015 | Shacham | G06F 17/5045 |
| | | | 716/100 |
| 9,311,444 B1* | 4/2016 | Teifel | G01R 31/318583 |
| 2002/0129334 A1* | 9/2002 | Dane | G06F 17/5045 |
| | | | 717/123 |
| 2002/0170007 A1 | 11/2002 | Rajsuman | |
| 2003/0056163 A1 | 3/2003 | Rajsuman | |
| 2003/0145286 A1 | 7/2003 | Pajak | |
| 2005/0273683 A1 | 12/2005 | Cote | |
| 2006/0242499 A1 | 10/2006 | Volz | |

FOREIGN PATENT DOCUMENTS

| | | |
|---|---|---|
| CN | 102262207 A | 11/2011 |
| CN | 103645435 A | 3/2014 |
| JP | H10105582 A | 4/1998 |

OTHER PUBLICATIONS

International Search Report in international application No. PCT/CN2015/078319, dated Aug. 4, 2015, 2 pgs.

English Translation of the Written Opinion of the International Search Authority in international application No. PCT/CN2015/078319, dated Aug. 4, 2015, 5 pgs.

* cited by examiner

INFORMATION PROCESSING BY INTERPENETRATING SIGNAL TRANSMISSION CHANNEL IN DESIGN FOR TESTABILITY OF CHIP

TECHNICAL FIELD

The disclosure relates to a technology for Integrated Circuit (IC) design, and in particular to an information processing method and device and a computer storage medium.

BACKGROUND

The IC design is increasingly complex and the cycle, for which ICs are put to the market, is needed to be increasingly shorter, thus it is needed for the developers to shorten the cycle, for which chips are put to the market, as much as possible while ensuring the quality.

At present, for different project requirements, different design techniques and design tools, requirements for Design for Testability (DFT) of a full chip are different. As a result, in the phase of circuit behaviour level description (RTL) design, different DFT design requirements need to be introduced to different modules, design codes and code hierarchies, and different DFT design requirements (such as a testable control interface of a storage unit, a low-power control interface and a functional test interface) will require to add different DFT design entities to RTL codes. Such design entities usually pass through multiple hierarchies and modules of codes of the full chip, and after the modules and hierarchies change, DFT design entities need to be updated, modified and added again, which requires designers and integrators to make sufficient communication and exchanges to confirm and analyse signals. Due to differences in individual understanding and signal naming, errors are difficult to be avoided, resulting in the iterative construction and release of a version and thus wasting a lot of human resources. These potential factors shorten the IC development cycle.

SUMMARY

In order to solve the existing technical problems, embodiments of the disclosure provide an information processing method and device and a computer storage medium.

An embodiment of the disclosure provides an information processing method including:
determining a module, for which a design for testability (DFT) processing is needed, in a chip;
establishing, in an including manner, a DFT signal transmission channel in the module for which the DFT processing is needed, and generating a channel file by using a corresponding port signal; and
interpenetrating the DFT signal transmission channel layer by layer until a top layer of the chip, according to an instantiated reference relationship.

In the above-mentioned solution, the determining the module, for which the DFT processing is needed, in the chip includes:
determining circuit behaviour level description RTL codes according to a code file type of the chip;
determining the module, for which the DFT processing is needed, according to a clock and reset unit library in the RTL codes.

In the above-mentioned solution, before determining the RTL codes according to the code file type of the chip, the method further includes:
obtaining location information of a code file of the chip according to a code filelist of the chip; and
finding the code file of the chip according to the location information.

In the abovementioned solution, the establishing, in the including manner, the DFT signal transmission channel in the module for which the DFT processing is needed, is:
establishing, in the including manner, the DFT signal transmission channel in three locations of a port declaration, a port description and a port instantiation in the module for which the DFT processing is needed.

In the above-mentioned solution, when more than two clock and reset unit libraries are instantiated in one module for which the DFT processing is needed, before the establishing, in the including manner, the DFT signal transmission channel in three locations of the port declaration, the port description and the port instantiation in the module for which the DFT processing is needed, the method further includes:
performing a statistical operation on port signals of the module for which the DFT processing is needed;
carrying on a combining processing on the port signals, after the statistical operation, of the module for which the DFT processing is needed, according to a function and a port name; and
accordingly, establishing, in the including manner, the DFT signal transmission channel in the module for which the DFT processing is needed, according to the port signals after the processing.

In the above-mentioned solution, the method further includes:
detecting matching and correctness of the DFT signal transmission channel, a hierarchical relationship and an instantiated relationship.

An embodiment of the disclosure further provides an information processing device including a determining unit, a channel establishing unit, a file generating unit and an interpenetrating unit,
the determining unit is configured to determine a module, for which a design for testability (DFT) processing is needed, in a chip;
the channel establishing unit is configured to establish, in an including manner, a DFT signal transmission channel in the module for which the DFT processing is needed;
the file generating unit is configured to generate a channel file by using a corresponding port signal and the established DFT signal transmission channel; and
the interpenetrating unit is configured to interpenetrate the DFT signal transmission channel layer by layer until a top layer of the chip, according to an instantiated reference relationship.

In the above-mentioned solution, the determining unit includes a first determining module and a second determining module,
the first determining module is configured to determine RTL codes according to a code file type of the chip; and
the second determining module is configured to determine the module for which the DFT processing is needed, according to a clock and reset unit library in the RTL codes.

In the abovementioned solution, the determining unit further includes an obtaining module and a finding module,
the obtaining module is configured to obtain location information of a code file of the chip according to a code filelist of the chip; and the finding module is configured to find the code file of the chip according to the location information.

In the above-mentioned solution, the channel establishing unit is further configured to perform a statistical operation on port signals of the module for which the DFT processing is needed; according to a function and a port name, carry on a combining processing on the port signals, after the statistical operation, of the module for which the DFT processing is needed; and establishing, in the including manner, the DFT signal transmission channel in the module for which the DFT processing is needed, according to the port signals after the processing.

In the above-mentioned solution, the device further includes a detecting unit configured to detect matching and correctness of the DFT signal transmission channel, a hierarchical relationship and an instantiated relationship.

An embodiment of the disclosure further provides a computer storage medium including a set of instructions, and when the set of instructions are executed, at least one processor is caused to execute the above information processing method.

The information processing method and device and the computer storage medium provided by the embodiments of the disclosure determine a module, for which the DFT processing is needed, in a chip; establish, in the including manner, a DFT signal transmission channel in the module for which the DFT processing is needed, and generate a channel file by using a corresponding port signal; and interpenetrate the DFT signal transmission channel layer by layer until the top layer of the chip according to an instantiated reference relationship. In this way, without the manual operation, a DFT related channel and the multi-hierarchy transferring of a module can be conveniently and quickly inserted based on different code environments and scenes, and different design requirements can be reused, thus improving the efficiency of IC design.

BRIEF DESCRIPTION OF THE DRAWINGS

In the figures, which are not necessarily drawn to scale, like reference numerals can refer to like elements in different views. Like reference numerals with different suffix letters may represent different examples of like elements. The figures generally show various embodiments discussed herein in way of illustration without limitation.

DETAILED DESCRIPTION

Hereinafter, detailed description will be further made to the disclosure with reference to the drawings and embodiments.

In various embodiments of the disclosure, a module, for which a design for testability (DFT) processing is needed, in a chip is determined; a DFT signal transmission channel is established in an including manner in the module for which the DFT processing is needed, and a channel file is generated by using a corresponding port signal; and the DFT signal transmission channel is interpenetrated layer by layer until a top layer of the chip, according to an instantiated reference relationship.

Embodiment 1

Figure 1:
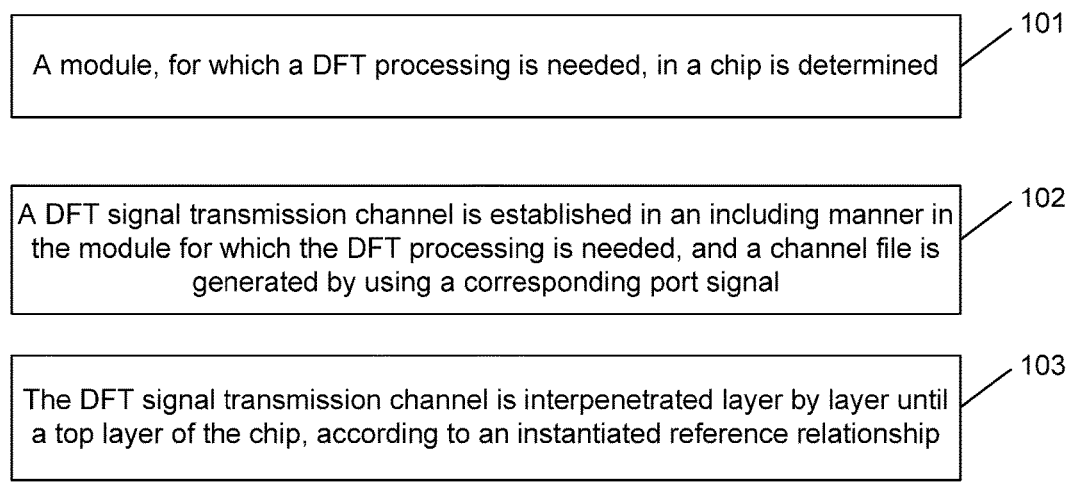
FIG. 1 is a schematic diagram of a flow of an information processing method according to Embodiment 1 of the disclosure.

As shown in FIG. 1, the information processing method according to the embodiments of the disclosure includes the following steps.

In S101: a module, for which the DFT processing is needed, in a chip is determined.

Specifically, RTL codes are determined according to a code file type of the chip; and the module, for which the DFT processing is needed, is determined according to a clock and reset unit library in the RTL codes.

before the RTL codes are determined according to the code file type of the chip; the method may further include:

location information of the code file of the chip is obtained according to a code filelist of the chip; and the code file of the chip is found according to the location information.

Here, the location information may include path directory, hierarchy, obtaining sequence information and the like of a code file of a chip and of each module in the chip.

The chip refers to the entire chip and emphasizes the entirety of the chip.

In S102: a DFT signal transmission channel is established in an including manner in the module for which the DFT processing is needed, and a channel file is generated by using a corresponding port signal.

Here, the DFT signal transmission channel is established in the including manner in three locations of a port declaration, a port description and a port instantiation in the module for which the DFT processing is needed.

When more than two clock and reset unit libraries are instantiated in one module for which the DFT processing is needed, before establishing, in the including manner, the DFT signal transmission channel in three locations of a port declaration, a port description and a port instantiation in the module for which the DFT processing is needed, the method may further include:

performing a statistical operation on port signals of the module for which the DFT processing is needed;

carrying on a combining processing on the port signals, after the statistical operation, of the module for which the DFT processing is needed, according to a function and a port name.

Accordingly, the DFT signal transmission channel is established in the including manner in the module for which the DFT processing is needed, according to the port signals after the processing, if in one module, a next level instantiates multiple clock and reset unit libraries and the multiple clock and reset unit libraries use the identical DFT port signal name, port signals need to be combined and unified. The port signals with different port signal names need to be kept in a differentiating way. In other words, a combining processing is performed on the port signals with the same function and the same port name information.

According to identifier information of the module for which the DFT processing is needed and in combination with characteristic information of the DFT signal transmission channel of the module for which the DFT processing is needed, an entity file of the channel file is generated.

The identifier information may be a module name of the module for which the DFT processing is needed.

In S103: the DFT signal transmission channel is interpenetrated layer by layer until the top layer of the chip, according to an instantiated reference relationship.

Here, this step aims to finish establishing an iterative channel for the chip codes.

The method may further include:

detecting and verifying matching and correctness of the DFT signal transmission channel, a hierarchical relationship and an instantiated relationship. In this way, the correctness of the established channel can be effectively ensured.

In a practical application, in the information processing method provided in the present embodiment, the above-mentioned operations can be executed by a script which can be written with languages such as Perl.

The information processing method provided by the embodiments of the disclosure determines a module, for which the DFT processing is needed, in a chip; establishes, in an including manner, a DFT signal transmission channel in the module for which the DFT processing is needed, and generates a channel file by using a corresponding port signal; and interpenetrates the DFT signal transmission channel layer by layer until the top layer of the chip, according to an instantiated reference relationship. In this way, without the manual operation, a DFT related channel and the multi-hierarchy transferring of a module can be conveniently and quickly inserted based on different code environments and scenes, and different design requirements can be reused, thus improving the efficiency of IC design.

The solutions provided by the embodiments of the disclosure establish, in the including manner, the DFT signal transmission channel in three locations of a port declaration, a port description and a port instantiation in the module for which the DFT processing is needed. In other words, because DFT signals are added in the including manner, only the DFT signals in three including-related files (the port declaration, the port description and the port instantiation) need to be modified, and the aim of modifying the signals for DFT design requirements of the entire chip can be reached, thus improving largely efficiency and enhancing universality. Through the DFT signals in three files, the same module can be used among different projects, improving the universality and reusability of the module among different projects.

Embodiment 2

Figure 2:
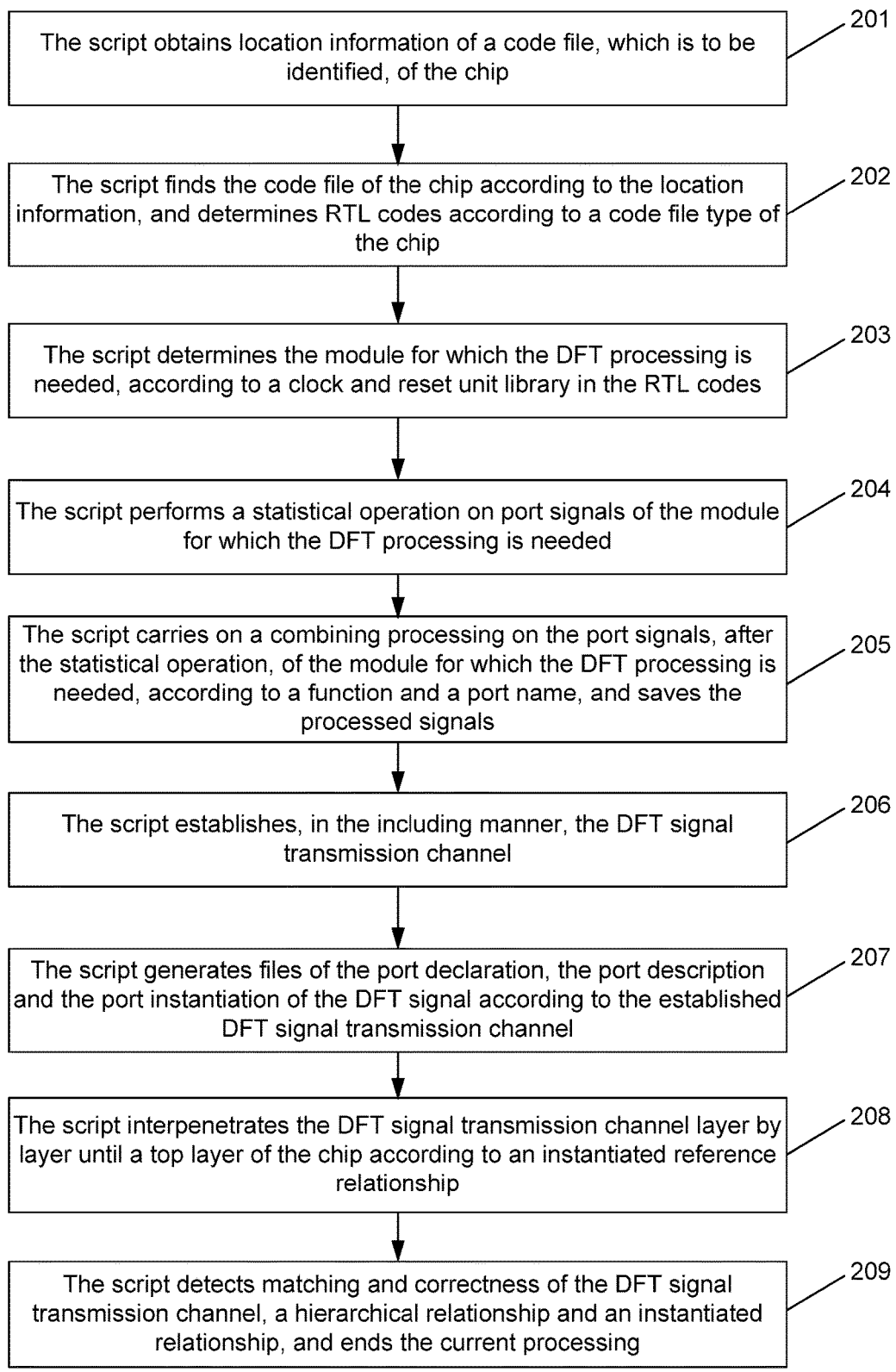
FIG. 2 is a schematic diagram of a flow of an information processing method according to Embodiment 2 of the disclosure.

In the application scenario of the present embodiment, a script is written with Perl language; based on an operation environment of a work station, a platform environment that can conform to the execution of the script with Perl language is set up, corresponding RTL code file to be processed and the script are stored in a common platform environment, and the script operation platform supports the pure command-line operation. As shown in FIG. 2, the information processing method according to the present embodiment includes the following steps.

In S201: the script obtains location information of a code file, which is to be identified, of the chip, according to a code filelist of a chip.

Here, through the determined code filelist, a developer sets the location information including path directory, hierarchy and obtaining sequence information of a code file of a chip and of each module in the chip. The script reads the location information and records the location information in a memory.

The chip refers to the entire chip and emphasizes the entirety of the chip.

The code file to be identified indicates all the code files of the chip.

In S202: the script finds the code file of the chip according to the location information, and determines RTL codes according to a code file type of the chip.

Here, the suffix of the RTL codes is generally .v or .vh. Therefore, according to the suffix of the code file (file type), the script can determine which codes are RTL codes.

In S203: according to a clock and reset unit library in the RTL codes, the script determines the module for which the DFT processing is needed.

Here, according to the code information which is already obtained, the script parses actual function types in the RTL codes, and according to tree hierarchical relationships of the RTL codes, looks for the lowest layer of the clock and reset unit library in the RTL codes in the chip. The DFT processing under design generally carries on adding and instantiation based on this type of modules, and therefore the script determines the module for which the DFT processing is needed, according to this.

In S204: the script performs a statistical operation on port signals of the module for which the DFT processing is needed.

Here, the script records a port name require to make a DFT function connection of the module for which the DFT processing is needed, for example, test_clk (testing clock input), test_reset (testing reset input), test_en (testing enabling input) signals and the like, in a memory for backup.

Figure 3:
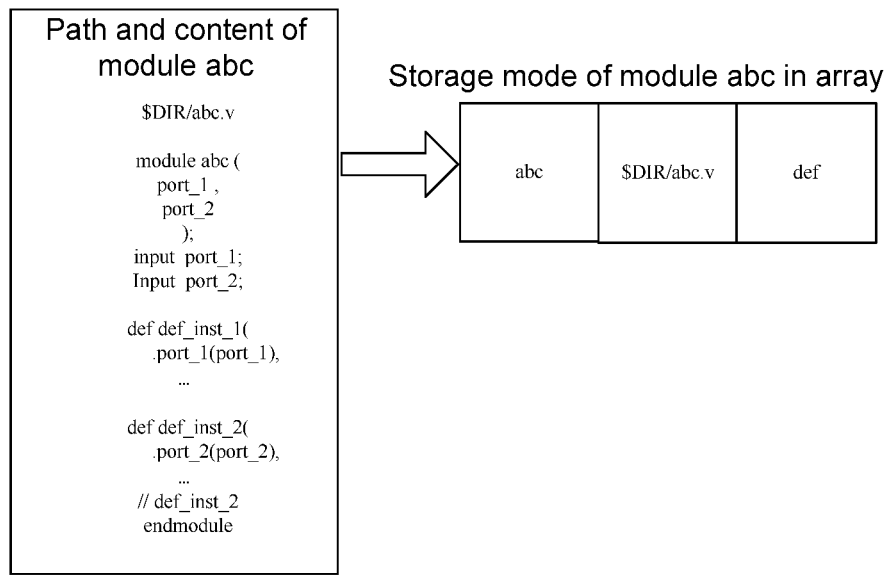
FIG. 3 is a schematic diagram of a storage mode of related information searched by a script according to Embodiment 2 of the disclosure.

For example, as shown in FIG. 3, after the script searches for specific instance(s) instantiated through each module, relevant information may be stored in the form of array. In FIG. 3, abc.v instantiates two instances of def_inst_1 and def_inst_2. The storage sequence in an array is abc (a module name), storage path of abc.v, instance1, instance2 . . . .

In S205: according to a function and a port name, the script carries on a combining processing on the port signals, after the statistical operation, of the module for which the DFT processing is needed, and saves the processed signals.

Figure 4:
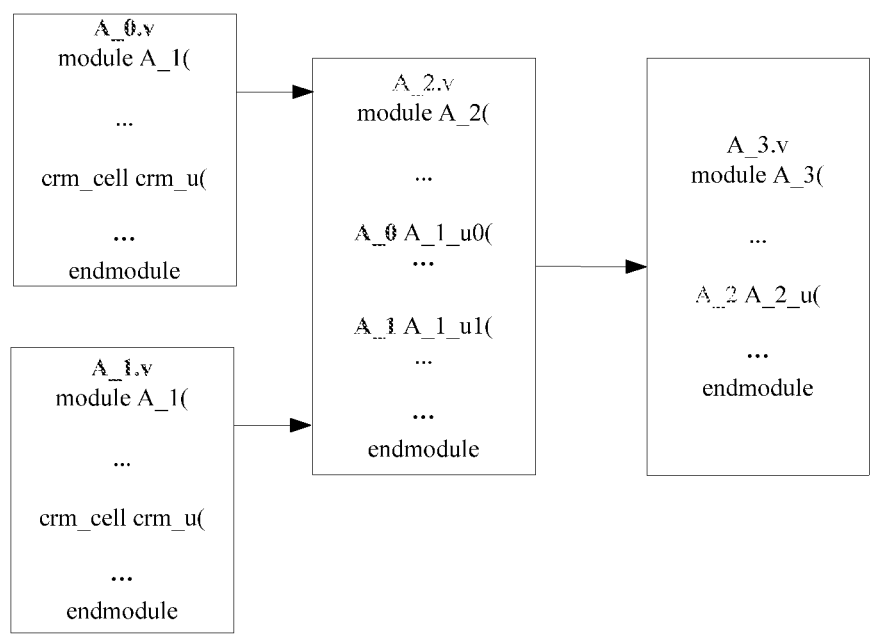
FIG. 4 is a schematic diagram of a script carrying on combining processing on port signals with the same function and the same port name information according to Embodiment 2 of the disclosure.

Here, if in one module, a next level instantiates multiple clock and reset unit libraries and the multiple clock and reset unit libraries use the identical DFT port signal name, port signals need to be combined and unified. The port signals with different port signal names need to be kept in a differentiating way. In other words, a combining processing is performed on the port signals with the same function and the same port name information, and the script carries on secondary save of the signals screened in this phase, as shown in FIG. 4.

In S206: the script establishes, in the including manner, the DFT signal transmission channel in three locations of a port declaration, a port description and a port instantiation in the module for which the DFT processing is needed.

Here, according to the secondary saved signal after screening, the script automatically searches for the three locations of the port declaration, the port description and the port instantiation in the module based on the RTL codes of the module, when a need for establishing a DFT signal transmission channel in the current module is determined. The searching for the three locations is carried on according to a specific structure and specification of grammar. After the three locations are determined, by the way of inserting RTL codes, the DFT signal transmission channel (i.e., the channel that the DFT port signal refers to) is established in the including manner in the three locations of the port declaration, the port description and the port instantiation in the module.

In S207: according to the established DFT signal transmission channel, the script generates files of the port declaration, the port description and the port instantiation of the DFT signal.

Here, after the establishing of the channel in the module is finished, the port signals after secondary screening and combined which are saved previously in the memory need to be written in an entity file of the channel. After this phase, according to characteristic information of the module name and by adding characteristic information that cooperates with the DFT signal transmission channel of the module, the script generates an entity file of a channel file, and the file is marked as .vh file type. The generated entity file needs to be incorporated in code filelist of a full chip.

Figure 5:
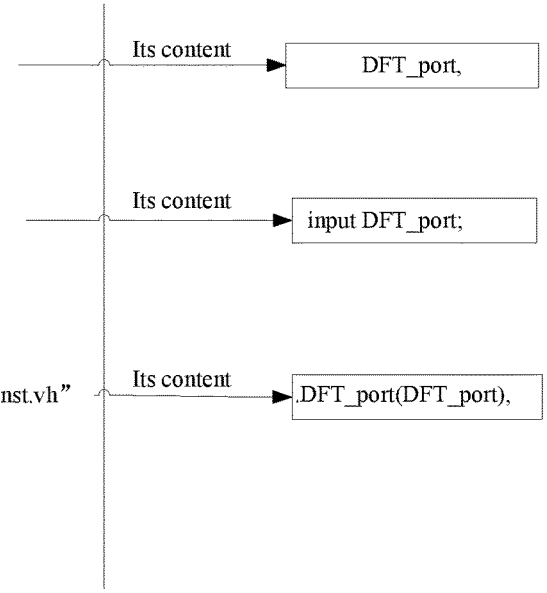
FIG. 5 is a schematic diagram of the storage of a generated channel file according to Embodiment 2 of the disclosure.
Figure 6:
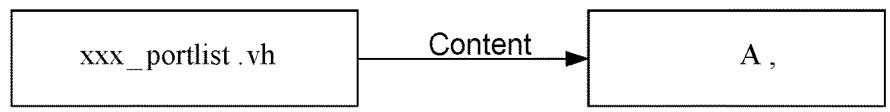
FIG. 6 is a schematic diagram of specific manifestation of content of each file according to Embodiment 2 of the disclosure.
Figure 6:
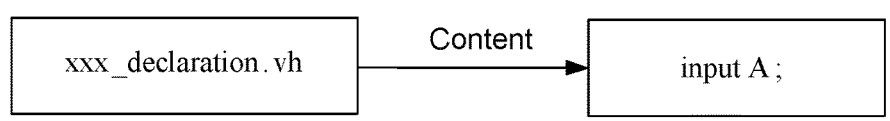
Figure 6:
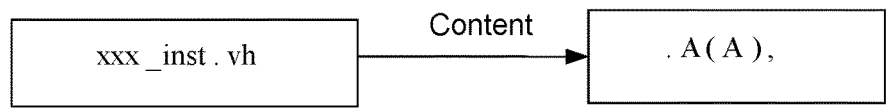

The generated file is shown as FIG. 5, in which xxx_portlist.vh represents a port declaration file, xxx_declaration.vh represents a port description file, and xxx_inst.vh represents a port instantiation file. For the specific manifestation forms of contents of the port declaration file, port description file and port instantiation file, reference is made to FIG. 6. In FIG. 6, A represents one port.

In S208: according to an instantiated reference relationship, the script interpenetrates the DFT signal transmission channel layer by layer until the top layer of the chip, and then executes S209.

Here, after finishing establishing the DFT signal transmission channel at the lowest layer of a tree code structure, the script automatically searches for the instantiated reference relationship of the module at the lowest layer by the module at upper layer. If module A being referred to by several upper-layer modules is searched for, all the modules at a main hierarchy need to be recorded in a memory for backup. Meanwhile, if module C instantiates module A and module B and the DFT signal transmission channels exist in both module A and module B, module C needs to include the DFT signal transmission channels of both module A and module B and distinguishes between characteristics. Statistical iteration is continuously made to the process according to the number of levels of instantiated hierarchies, and is ended until the highest hierarchy for the codes. Therefore, the number of instantiated channel at the highest hierarchy is the largest.

In S209: the script detects matching and correctness of the DFT signal transmission channel, a hierarchical relationship and an instantiated relationship.

Here, after finishing establishing an iterative channel for the chip codes, the script automatically checks the matching and correctness of entity files corresponding to the DFT signal transmission channel, the hierarchical relationship the instantiated relationship of the signal of the chip, so as to judge whether there is a port signal loss, whether instantiation of port signals conforms to multi-level hierarchies, and whether there is a loss or a failure of being identified when the DFT signal transmission channel cross multiple hierarchies, and the script automatically loads a channel including file to carry on an entirety identification and check.

In the technical solutions provided in the present embodiment, because the script obtains location information of a code file, which is to be identified, of the chip from the code filelist of the chip, the script can automatically identify the hierarchy structure of a filelist, used variables and path of upper-layer filelist, thus being capable of identify any number of environmental variables cshrc without making definition in cshrc.

Embodiment 3

Figure 7:
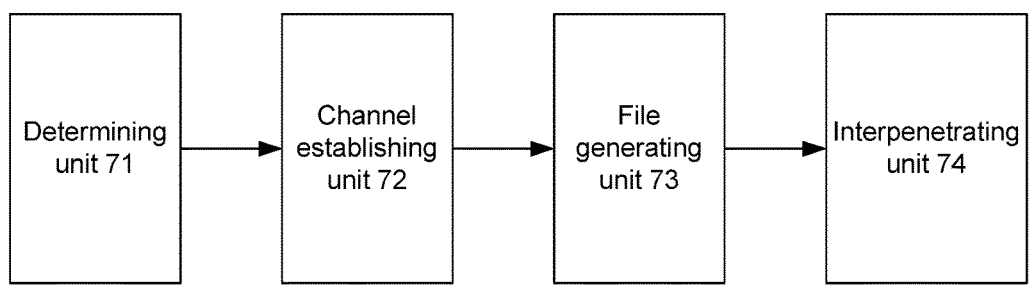
FIG. 7 is a schematic diagram of the structure of an information processing device according to Embodiment 3 of the disclosure.

To realize the method according to the embodiments of the disclosure, the present embodiment provides an information processing device, as shown in FIG. 7. The device includes a determining unit 71, a channel establishing unit 72, a file generating unit 73 and an interpenetrating unit 74, the determining unit 71 is configured to determine a module, for which a DFT processing is needed, in a chip;

the channel establishing unit 72 is configured to establish, in an including manner, a DFT signal transmission channel in the module for which the DFT processing is needed;

the file generating unit 73 is configured to generate a channel file by using a corresponding port signal and the established DFT signal transmission channel; and the interpenetrating unit 74 is configured to interpenetrate the DFT signal transmission channel layer by layer until a top layer of the chip, according to an instantiated reference relationship.

The chip refers to the entire chip and emphasizes the entirety of the chip.

The determining unit 71 may include a first determining module and a second determining module, the first determining module is configured to determine RTL codes according to a code file type of the chip; and the second determining module is configured to determine the module for which the DFT processing is needed, according to a clock and reset unit library in the RTL codes.

The determining unit 71 may further include an obtaining module and a finding module, the obtaining module is configured to obtain location information of a code file of the chip according to a code filelist of the chip; and the finding module is configured to find the code file of the chip according to the location information.

Here, the location information may include path directory, hierarchy and obtaining sequence information of a code file of a chip and of each module in the chip.

The channel establishing unit 72 is specifically configured to establish, in the including manner, the DFT signal transmission channel in three locations of a port declaration, a port description and a port instantiation in the module for which the DFT processing is needed.

When more than two clock and reset unit libraries are instantiated in one module for which the DFT processing is needed, the channel establishing unit 72 is further configured to perform a statistical operation on port signals of the module for which the DFT processing is needed; according to a function and a port name, carry on a combining processing on the port signals, after the statistical operation, of the module for which the DFT processing is needed; and establishing, in the including manner, the DFT signal transmission channel in the module for which the DFT processing is needed, according to the port signals after the processing.

If in one module, a next level instantiates multiple clock and reset unit libraries and the multiple clock and reset unit libraries use the identical DFT port signal name, port signals need to be combined and unified. The port signals with different port signal names need to be kept in a differentiating way. In other words, a combining processing is performed on the port signals with the same function and the same port name information.

According to identifier information of the module for which the DFT processing is needed and in combination with characteristic information of the DFT signal transmission channel of the module for which the DFT processing is needed, the channel establishing unit 72 generates an entity file of the channel file.

The identifier information may be a module name of the module for which the DFT processing is needed.

The processing of the interpenetrating unit 74 aims to finish establishing an iterative channel for the chip codes.

The device may further include a detecting unit configured to detect and verify matching and correctness of the DFT signal transmission channel, a hierarchical relationship and an instantiated relationship. In this way, the correctness of the established channel can be effectively ensured.

In a practical application, the determining unit 71, the channel establishing unit 72, the file generating unit 73, the interpenetrating unit 74, the detecting unit, the first determining module, the second determining module, the obtaining module and the finding module can be realized through a CPU (Central Processing Unit), a DSP (Digital Signal Processor) or a FPGA (Field-Programmable Gate Array) in the information processing device.

In the information processing device provided by the embodiments of the disclosure, the determining unit 71 determines a module, for which the DFT processing is needed, in a chip; the channel establishing unit 72 establishes, in the including manner, a DFT signal transmission channel in the module for which the DFT processing is needed, and the file generating unit 73 generates a channel file by using a corresponding port signal; and according to an instantiated reference relationship, the interpenetrating unit 74 interpenetrates the DFT signal transmission channel layer by layer until the top layer of the chip. In this way, without the manual operation, a DFT related channel and the multi-hierarchy transferring of a module can be conveniently and quickly inserted based on different code environments and scenes, and different design requirements can be reused, thus improving the efficiency of IC design.

In solutions provided by the embodiments of the disclosure, the channel establishing unit 72 establishes, in the including manner, the DFT signal transmission channel in three locations of a port declaration, a port description and a port instantiation in the module for which the DFT processing is needed. In other words, because DFT signals are added by the way of including, only the DFT signals in three including-related files (the port declaration, the port description and the port instantiation) need to be modified, and the aim of modifying the signals of DFT design requirements of the entire chip can be reached, thus improving largely efficiency and enhancing universality. Through the DFT signals in three files, the same module can be used among different projects, improving the universality and reusability of the module among different projects.

Those skilled in the art should recognize that embodiments of the disclosure can be provided as a method, a system or a computer program product. Therefore, the disclosure can take the form of hardware embodiments, software embodiments or embodiments combining both software and hardware. Furthermore, the disclosure can take the form of computer program products implemented on one or more computer available storage media including computer available program codes (including without limitation to a magnetic-disk storage and an optical storage).

The disclosure is described with reference to the flowcharts and/or block diagrams of the method, the device (system) or the computer program product according to the embodiments of the disclosure. It should be understood that each flow and/or block in the flowcharts and/or block diagrams and the combination of flows and/or blocks in the flowcharts and/or block diagrams can be realized via computer program instructions. These computer program instructions can be provided for processors of a general-purpose computer, a special-purpose computer, an embedded processor or other programmable data processing device to generate a machine, so that the instructions executed by the processor of the computer or other programmable data processing device generate a device used for realizing the functions designated by one flow or more flows in the flowcharts and/or one block or more blocks in the block diagrams.

These computer program instructions can also be stored in a computer readable storage that can instruct the computer or other programmable data processing device to work in a specific way, so that instructions stored in the computer readable storage generate a manufacturing product including an instruction device. The instruction device realizes the functions designated by one flow or more flows in the flowcharts and/or one block or more blocks in the block diagrams.

These computer program instructions can also be loaded on the computer or other programmable data processing device, so that a series of operation steps can be performed on the computer or other programmable device to generate the processing realized by the computer, thus the instructions executed on the computer or other programmable data processing device provide steps for realizing the functions designated by one flow or more flows in the flowcharts and/or one block or more blocks in the block diagrams.

On this basis, an embodiment of the disclosure further provides a computer storage medium including a set of instructions, and at least one processor is caused to execute the above-mentioned information processing methods when the set of instructions are executed.

What are described above are only particular embodiments of the disclosure, and is not intended to limit the protection scope of the disclosure.

What is claimed is:

1. An information processing method, applied in an information processing device comprising a processor, comprising:
   determining a module, for which a design for testability (DFT) processing is needed, in a chip in an integrated circuit;
   establishing, in an including manner, a DFT signal transmission channel in three locations of a port declaration, a port description and a port instantiation in the module for which the DFT processing is needed;
   writing, by the processor, port signal of the module for which the DFT processing is needed into a channel file to generate entity files of the channel file, wherein the channel file is an entity file of the DFT signal transmission channel and the entity files of the channel file comprise: a port declaration file, a port description file and a port instantiation file;
   interpenetrating the DFT signal transmission channel layer by layer until a top layer of the chip, according to an instantiated reference relationship; and modifying, by the processor, only DFT signals in the port declaration file, the port description file and the port instantiation file to modify signals of DFT design requirements of the chip.

2. The method according to claim 1, wherein the determining the module, for which the DFT processing is needed, in the chip comprises:
determining circuit behaviour level description (RTL) codes according to a code file type of the chip; and
determining the module, for which the DFT processing is needed, according to a clock and reset unit library in the RTL codes.

3. The method according to claim 2, wherein before determining the RTL codes according to the code file type of the chip, the method further includes:
obtaining location information of a code file of the chip according to a code filelist of the chip; and
finding the code file of the chip according to the location information.

4. A non-transitory computer readable storage medium comprising a set of instructions, wherein when the set of instructions are executed, at least one processor is caused to execute the information processing method according to claim 3.

5. A non-transitory computer readable storage medium comprising a set of instructions, wherein when the set of instructions are executed, at least one processor is caused to execute the information processing method according to claim 2.

6. The method according to claim 1, wherein when more than two clock and reset unit libraries are instantiated in one module for which the DFT processing is needed, before the establishing, in the including manner, the DFT signal transmission channel in three locations of the port declaration, the port description and the port instantiation in the module for which the DFT processing is needed, the method further comprises:
performing a statistical operation on port signals of the module for which the DFT processing is needed;
carrying on a combining processing on the port signals, after the statistical operation, of the module for which the DFT processing is needed, according to a function and a port name; and
accordingly, establishing, in the including manner, the DFT signal transmission channel in the module for which the DFT processing is needed, according to the port signals after the processing.

7. A non-transitory computer readable storage medium comprising a set of instructions, wherein when the set of instructions are executed, at least one processor is caused to execute the information processing method according to claim 6.

8. The method according to claim 1, wherein the method further comprises:
detecting matching and correctness of the DFT signal transmission channel, a hierarchical relationship and an instantiated relationship.

9. A non-transitory computer readable storage medium comprising a set of instructions, wherein when the set of instructions are executed, at least one processor is caused to execute the information processing method according to claim 8.

10. A non-transitory computer readable storage medium comprising a set of instructions, wherein when the set of instructions are executed, at least one processor is caused to execute the information processing method according to claim 1.

11. An information processing device, applied in an integrated circuit, comprising:
a processor; and
a memory for storing instructions executable by the processor;
wherein the processor is configured to:
determine a module, for which a design for testability (DFT) processing is needed, in a chip in the integrated circuit;
establish, in an including manner, a DFT signal transmission channel in three locations of a port declaration, a port description and a port instantiation in the module for which the DFT processing is needed;
write port signal of the module for which the DFT processing is needed into a channel file to generate entity files of the channel file, wherein the channel file is an entity file of the DFT signal transmission channel and the entity files of the channel file comprise: a port declaration file, a port description file and a port instantiation file;
interpenetrate the DFT signal transmission channel layer by layer until a top layer of the chip, according to an instantiated reference relationship; and
modify only DFT signals in the port declaration file, the port description file and the port instantiation file to modify signals of DFT design requirements of the chip.

12. The device according to claim 11, wherein the processor is configured to:
determine circuit behaviour level description (RTL) codes according to a code file type of the chip; and
determine the module for which the DFT processing is needed, according to a clock and reset unit library in the RTL codes.

13. The device according to claim 12, wherein the processor is configured to:
obtain location information of a code file of the chip according to a code filelist of the chip; and
find the code file of the chip according to the location information.

14. The device according to claim 11, wherein the processor is further configured to:
perform a statistical operation on port signals of the module for which the DFT processing is needed;
according to a function and a port name, carry on a combining processing on the port signals, after the statistical operation, of the module for which the DFT processing is needed; and
establish, in the including manner, the DFT signal transmission channel in the module for which the DFT processing is needed, according to the port signals after the processing.

15. The device according to claim 11, wherein the processor is configured to detect matching and correctness of the DFT signal transmission channel, a hierarchical relationship and an instantiated relationship.

* * * * *